United States Patent [19]

Fong

[11] Patent Number: 5,241,507

[45] Date of Patent: Aug. 31, 1993

[54] ONE TRANSISTOR CELL FLASH MEMORY ASSAY WITH OVER-ERASE PROTECTION

[75] Inventor: Vincent Fong, Fremont, Calif.

[73] Assignee: Hyundai Electronics America, San Jose, Calif.

[21] Appl. No.: 695,481

[22] Filed: May 3, 1991

[51] Int. Cl.[5] .................. G11C 11/40; G11C 16/00
[52] U.S. Cl. .................... 365/218; 365/185; 365/186; 365/900
[58] Field of Search ............. 365/185, 186, 218, 900

[56] References Cited

U.S. PATENT DOCUMENTS

| | | |
|---|---|---|
| 3,693,174 | 9/1972 | MacKnight . |
| 3,750,115 | 7/1973 | Mundy . |
| 3,800,297 | 3/1974 | Mundy et al. . |
| 4,064,494 | 12/1977 | Dickson et al. . |
| 4,387,447 | 6/1983 | Klaas et al. . |
| 4,652,897 | 3/1987 | Okuyama et al. . |
| 4,725,983 | 2/1988 | Terada . |
| 4,783,766 | 11/1988 | Samachisa et al. ........... 365/218 |
| 4,907,194 | 3/1990 | Yamada et al. . |
| 4,937,790 | 6/1990 | Sasaki et al. . |
| 4,942,556 | 7/1990 | Sasaki et al. . |
| 4,999,812 | 3/1991 | Amin ........... 365/900 |
| 5,097,444 | 3/1992 | Fong ........... 365/218 |
| 5,122,985 | 6/1992 | Santin ........... 365/185 |

FOREIGN PATENT DOCUMENTS

| | | | |
|---|---|---|---|
| 0050398 | 2/1990 | Japan | 365/218 |
| 2220811 | 1/1990 | United Kingdom | 365/218 |

OTHER PUBLICATIONS

Lahti et al., "Store Data in a Flash," *Byte* magazine, pp. 311-318, Nov. 1990.

*Primary Examiner*—John Zazworsky
*Attorney, Agent, or Firm*—Townsend and Townsend Khourie and Crew

[57] ABSTRACT

A memory array formed from single transistor flash cells employs prevention circuitry for minimizing the effect of any floating gates in an over-erased state when accessing data stored in the memory array device. The prevention circuit includes a column line coupling a current limiting device in each row together in a common column. The memory array device also employs a row current limiting device which couples that row of flash cells to the erase potential. The second row switching means is activated to prevent a false signal generated by an over-erased flash cell in the same column as a selected flash cell being accessed for data from masking the data retrieval from the desired flash cell.

10 Claims, 2 Drawing Sheets

ONE TRANSISTOR CELL FLASH MEMORY ASSAY WITH OVER-ERASE PROTECTION

BACKGROUND OF THE INVENTION

This invention relates generally to non-volatile semiconductor memory arrays, and more specifically, to non-volatile memory using flash transistors in which over-erase protection is provided.

Non-volatile memory storage systems have progressed rapidly from read-only-memory (ROM) to electrically erasable programmable read-only-memory (EEPROM) Memory arrays using EEPROM cells are desirable because they are easily programmable, can be readily erased, and can store data for an almost indefinite time.

One example of a memory storage system having memory cells with EEPROM elements is described in U.S. Pat. No. 4,725,983, issued to Terada. This system requires a memory cell having two MOS transistors and an FLOTOX type memory transistor. The drawback with this arrangement is that each memory cell requires three transistors which require a large area of silicon, significantly reducing memory density.

Another example of a memory system having memory cells employing EEPROMs is found in U.S. Pat. No. 4,942,556, issued to Sasaki et al. The memory cell therein includes both a MIS transistor and an EEPROM element. Alternatively, the memory cell can employ an EPROM element and a second transistor. The drawback with either cell arrangement is the large area required for the cell structure as compared to a single transistor cell.

Another example of a memory system is U.S. Pat. No. 4,064,494, issued to Dickson et al. This system uses a memory cell which incorporates two non-volatile storage devices. The use of two storage devices again requires more surface area than a single transistor memory cell.

U.S. Pat. No. 4,387,447, issued to Klaas et al., shows a memory array employing a memory cell having a single EPROM element. Several additional switching and load devices are required in the memory array to adequately read, program and erase data. In addition, the EPROM cells require ultraviolet light to discharge the floating gates of the EPROM. Generally, the time required for such an erase cycle is prohibitively long compared to the minimal erase time required for a conventional EEPROM.

A single transistor memory cell is most desirable in a programmable, non-volatile memory array. The transistor used in such a memory array is typically a floating gate field effect transistor that uses the Fowler-Nordheim tunneling mechanism during the erase cycle. One problem with use of the Fowler-Nordheim tunneling mechanism during the erase cycle is that the floating gate in the transistor can become over-erased. During the erase cycle negative charges on the floating gate are discharged from the floating gate. This discharging of negative charges cannot be precisely controlled, and can lead to an excess discharge of negative charges during the erase cycle. When an excess of negative charge has been removed, a net positive charge remains on the floating gate after the erase cycle. This positive charge causes an unwanted channel under the floating gate when the control gate is selected for a read cycle. Under certain circumstances, the channel allows a current flow from the drain to the source providing erroneous data.

One solution to the problem of over-erasing the floating gate is to add a second transistor to each cell to block output of erroneous data resulting from the over-erased floating gate. This two-transistor cell then forms each EEPROM memory cell.

Several drawbacks exist, however, in the use of EEPROM memory cells. One drawback is that EEPROM memory cells require sophisticated manufacturing processes, thus increasing their cost of manufacture. A second drawback is that EEPROM memory cells require two transistors per cell and, as such, require more surface area on a silicon wafer than a single transistor cell, thereby further increasing cost.

One approach of simplifying the EEPROM memory cell has been to use a split gate memory cell that is essentially the EEPROM memory cell combined into a hybrid two transistor design that requires less area on a silicon wafer. The manufacturing process for the split gate transistor is less sophisticated than that for the EEPROM memory cell, but is still more sophisticated than that for a single transistor memory cell. Furthermore, the split gate cell also requires more area than a single transistor cell.

Therefore, what is needed is a non-volatile memory array having a single transistor memory cell which array is not susceptible to read errors caused by having an over-erased floating gate.

SUMMARY OF THE INVENTION

The present invention provides a non-volatile memory array of single transistor cells, yet which is protected against the undesirable effects of over-erased gates. The memory array itself includes a plurality of memory cells arranged in rows and columns. Each row of memory cells includes a control line connected to the control gates of each memory cell in the row, and a row line connected to the drain of each memory cell in the row. The columns of memory cells are interconnected by a column conductor or bit line which joins all of the sources of transistors in a common column.

In accordance with the invention, a prevention means is employed to eliminate the effects of over-erased floating gates. Preferably, the prevention means includes a first row switch in each row, an isolation device in each row, and a second row switch to couple the row lines of two different rows together in response to a control signal. The first row switch preferably is a field effect transistor having a drain coupled to the row line, a control gate coupled to the floating gates of each memory cell in that row, and a drain coupled to an extra column line. The isolation device is connected between the source of potential used to erase the row of memory cells, and the drains of all of the memory cells in that row.

Preferably, the prevention means for eliminating the effect of over-erased floating gates also includes a second row switch, typically a field effect transistor. The transistor is connected to short together two row lines of memory cells in response to a control signal being supplied to its gate.

As a result of employing the prevention means, the non-volatile memory array can employ single transistor floating gate memory cells which are susceptible to being over-erased during the erase operation. Thus, despite the necessity of adding five transistors for every two rows of memory cells (two first row switches, two limiting transistors and one second row switch), the overall density of the memory array is enormously increased over memory arrays of the prior art which required two transistors per memory cell.

The invention may be better understood by reference to the following detailed description in connection with the accompanying drawings.

DESCRIPTION OF THE PREFERRED EMBODIMENT

Figure 1:
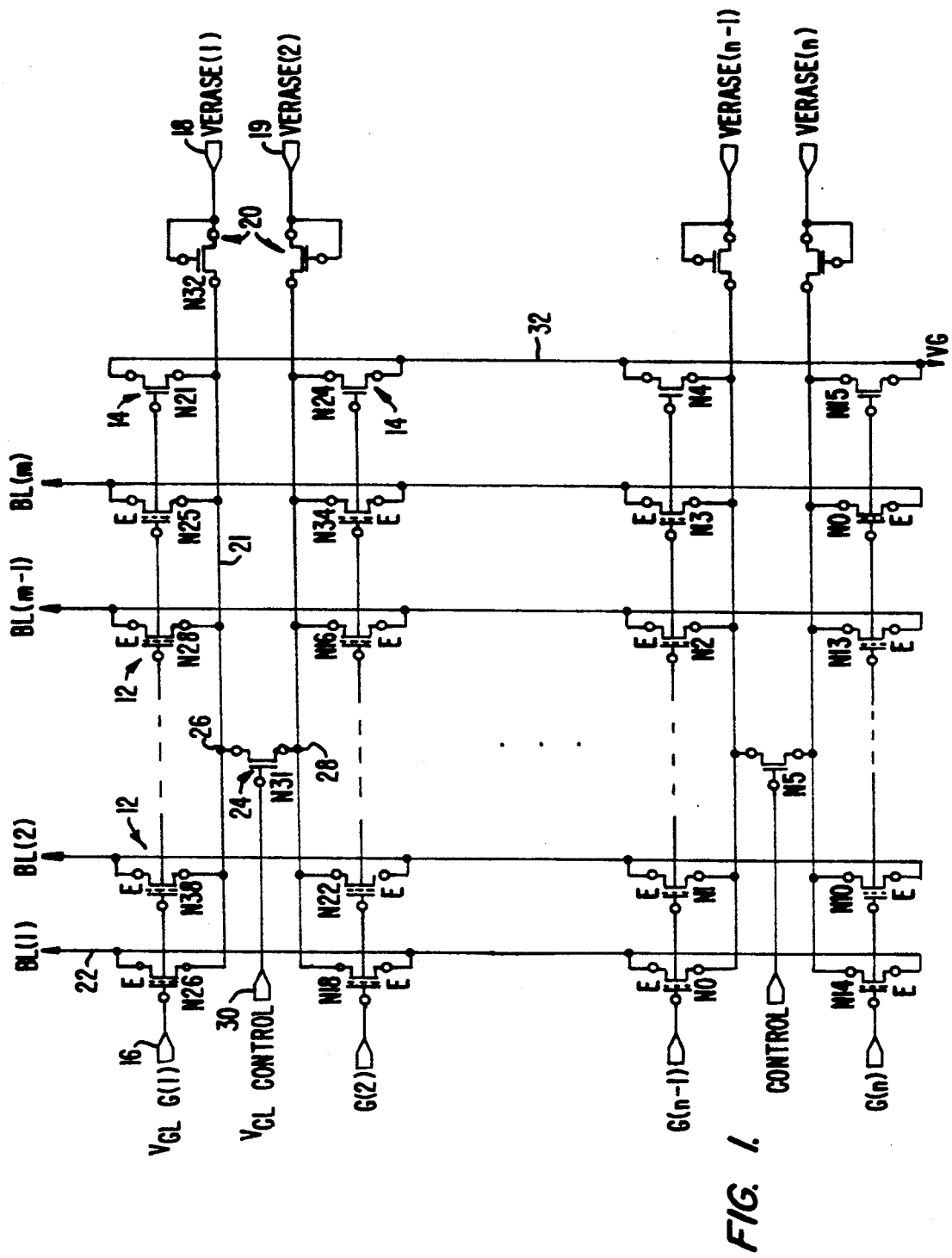
FIG. 1 shows a memory array with over-erase protection according to the present invention.

FIG. 1 is a schematic diagram of a flash memory cell array structure 10. The memory array 10 is an M×N array having N rows by M columns of memory cells 12. Each row in memory array 10 includes M memory cells 12. Each memory cell 12 is a flash transistor device having drain, source and control gate nodes, and a floating gate. The control gates of each memory cell 12 in the same row are connected together with a gate line 16. The source of each memory cell 12 in the same row are connected together to an erase line 18.

Each row of memory cells also includes a first row switch, preferably an MOS transistor 14. (The term MOS is used herein to refer to transistors of that type, regardless of whether their structure employs metal or oxide. The gate of MOS transistor 14 is commonly connected with the control gates of each of the memory cells 12 in that row. The source of transistor 14 is connected to the eras line 18 in common with the sources of all of the memory cells in that row. The drain of transistor 14 is connected to a connection 32 to commonly couple all of the drains of he row switch transistors for each row together and to virtual ground potential $V_G$.

An isolation device, typically a transistor 20 connected as a diode is provided in each row between a potential source $V_{ERASE}$ used during erasing of the memory, and the row line 21. As shown, the gate of transistor 20 is connected to the erase potential, as well as its drain. Transistor 20 isolates the input erase voltage from the source lines. The N-channel MOS transistor with diode connection is one way to obtain the isolation and is preferred because it is of the same type as the memory cell transistor. This device can be a P-channel transistor, or other type of transistor.

Pairs of memory cell rows are selectively connectable together via a row switch device 24, also preferably a MOS transistor. Although the figure shows adjacent rows being commonly connected by transistor 24, andy pair of rows may be so connected. Transistor 24 preferably couples are first node 26 on erase line 18 with a second node 28 on an adjacent erase line 19. Transistor 24 is controlled by a control line 30. Preferably, transistor 24 is a MOS device having a gate node serving as the control node, with source node and drain node connected to node 26 and node 28. Switching device 24 is employed in the preferred embodiment, but is optional in other embodiments.

Transistor 24 isolates the two adjacent source lines during READ operations so no current is coupled from one row of transistors to the other row of transistors. The transistor 24 couples the two lines during ERASE operations. This transistor also enhances the operating reliability because it eliminates the need for tight process control and precise circuit operation. This transistor can be eliminated if tight process control and precise circuit operation are achieved.

The table below shows operating conditions for three modes of operation—READ, PROGRAM and ERASE—for the memory cells. During the READ operation a small voltage is applied to the appropriate column bit line (BL) and the appropriate row control gate line (GL) is turned on with a positive voltage thereby addressing a single desired memory cell. If the addressed cell is a programmed cell which has a threshold voltage greater than 5 volts, no channel will be formed and no current flows through it. If the addressed cell is unprogrammed (erased), its threshold voltage will be about 1.5 volts and a channel will be formed. N-channel MOS transistor 14 will also turn on and a current will flow from the bit line to $V_G$, typically ground. The remaining lines, voltage ($V_G$), erase line ($V_{ERASE}$), and control, are all held at zero, while node 28 is in a "don't care" state.

Higher voltages are applied to both the bit line (BL) and gate line (GL) during the PROGRAM operation, while the remaining lines have the same voltage as that applied during the READ operation. The higher voltages generate "hot electrons" to program the cell to the "off" state.

During the ERASE operation the bit line and VG are allowed to "float," while the voltage on the gate line is held at zero. Meanwhile, the $V_{ERASE}$ line and node 28 (via the adjacent erase line 19) have their respective voltages applied as indicated in the table, where "x" means "don't care."

| Mode of Operations | Bias Voltages | | | | | |
|---|---|---|---|---|---|---|
| | BL | GL | $V_G$ | $V_{ERASE}$ | Control | Node 28 |
| Reading | 1 v | 5 v | 0 v | 0 v | 0 v | x |
| Programming | 6 v | 12 v | 0 v | 0 v | 0 v | x |
| Erasing | Float | 0 v | Float | 15 v | 5 v | 15 v |

Figure 2:
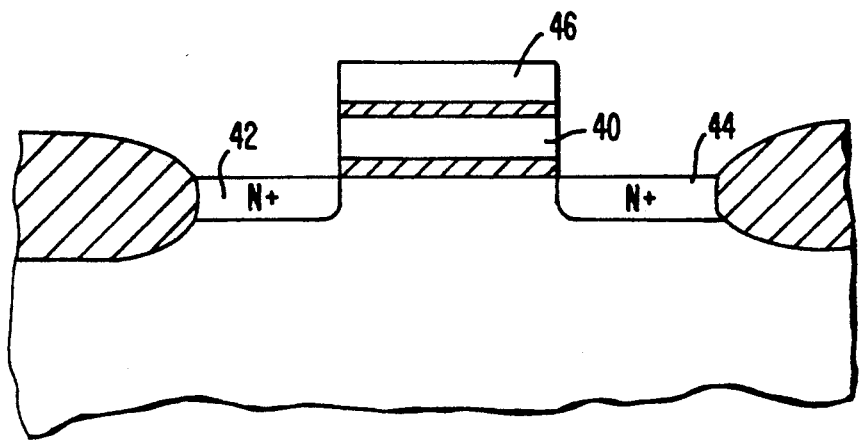
FIG. 2 shows a one transistor memory cell used in the memory array shown in FIG. 1.

Each memory cell 12 is preferably a conventional single-transistor flash cell like that shown in FIG. 2. Transistor 12 is an N-channel MOS having a floating gate 40, a source 42, a drain 44, and a control gate 46. Floating gate 40 stores a negative charge when programmed and can be erased via Fowler-Nordheim tunneling.

A solution for blocking the effect of an over-erased floating gate is to add transistors 14 and 24 to each row of memory cells, and to add transistor 24 to each pair of rows as shown in FIG. 1. The addition of transistors 14, 20, and 24 eliminate the need for each memory cell to have an additional transistor to prevent current flow in the event the floating gate is in an over-erased state. An example of how transistors 14, 20, and 24 prevent an over-erased memory cell from corrupting the requested data is described below.

Figure 3:
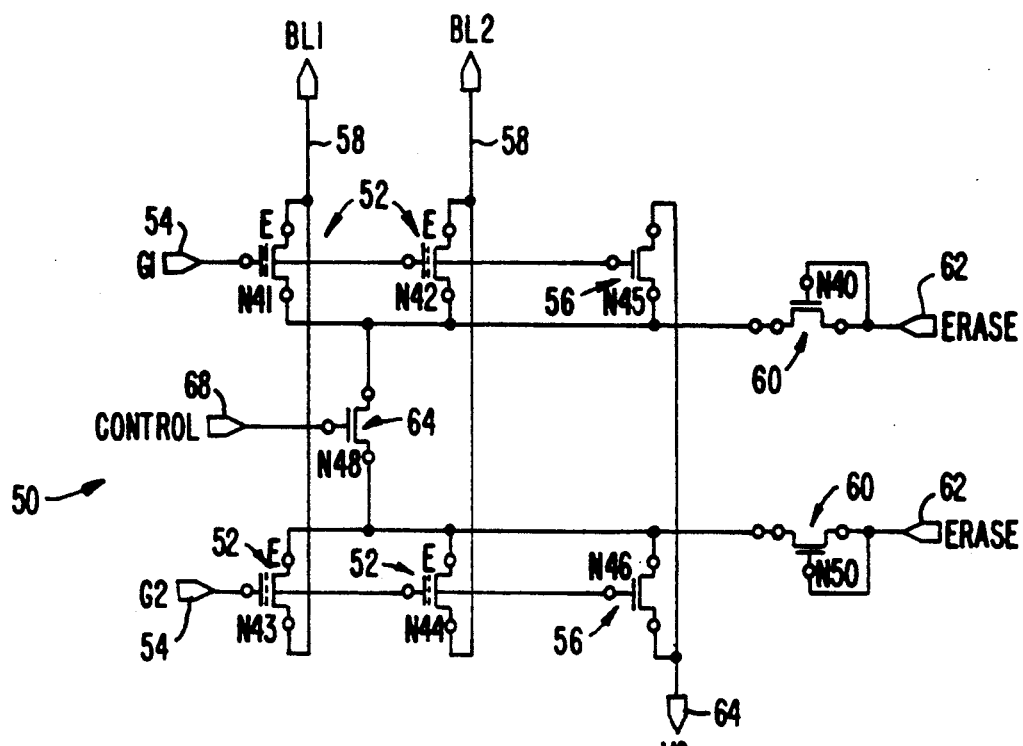
FIG. 3 shows a 2×2 memory array having over-erase protection according to the present invention.

FIG. 3 is a schematic diagram of a 2×2 memory array 50 having over-erase protection and is used to illustrate, on a small scale, how the over-erase protection operates to prevent over-erased cells from corrupting requested data. There are two memory cells 52 in each row and in each column of memory array 50. Each memory cell 52 is a flash cell having a drain, a control gate, a source and a floating gate. Gate line 54 connects the control gates of each memory cell 52 in the same row. A transistor 56 is further provided in each row and is connected to be controlled by gate line 54. Preferably, transistor 56 is a MOS device having a drain, a gate, and a source, with the gate connected to gate line 54. Each column of memory cells 52 has a bit line 58 which connects the drains of each memory cell 52 in the same column. The sources of memory cells 52 in the same row are connected together and are further connected to a transistor 60. Preferably, device 60 is an N-channel MOS having a drain, a gate, and a source. The drain of 60 is coupled to the sources of each memory cell 52 in the same row. The source and gate of transistor 60 are connected together to form a diode connection to an erase line 62 coupled to potential source $V_{ERASE}$. The drains of each memory cell 56 in the same column are connected together and to a potential source 64, preferably ground. Another transistor selectively couples together erase lines 62 from two rows. Preferably, device 64 is also an N-channel MOS device having a drain, a gate, and a source with the gate connected to a control line 68.

The operating voltages of the memory array 50 are given in the following table where bit line 58 is represented by BL, common line 64 is represented by $V_G$, gate line 54 is represented by G, control line 68 is represented by Control, and erase line 62 is represented by ERASE, and "F" means "floating":

56 and control switch 64 being "off" during the READ mode. This allows data based only on the program state of the floating gate of the selected cell, in other words over-erased cells do not generate false information.

During the PROGRAM mode, "hot electrons" are generated at the selected cell to program the cell to be in the "off" state. No "hot electrons" are generated at unselected cells since their respective bit lines and gate lines are not appropriately biased.

During the ERASE mode, electron tunneling occurs when the voltage on the erase line 62 is about 15 volts. This high voltage is supplied from erase potential 62 at the same time control switch 64 is turned on. All the memory cells connected to control switch 64 will then have a tunneling current. The tunneling current discharges the negative charges from each floating gate of each memory cell, thereby lowering the floating gate charge $V_T$ on each cell.

Since the basic memory cell of this invention is a one transistor flash memory cell, instead of a two-transistor EEPROM memory cell or split transistor memory cell, the space required for fabrication is significantly reduced. Although three additional transistors are added per pair of rows of memory cells to prevent erroneous data caused by over-erasing, the space required for these three transistors is minimal and can be less than 1 percent of the overall space used for a memory cell array having over one million cells. Compared to that required for the two-transistor or split gate memory

| Mode of Operation | Selected Cell Biases | | | | | Unselected Cell Biases | | | | |
|---|---|---|---|---|---|---|---|---|---|---|
| | BL | GL | VG | Control | ERASE | BL | G | VG | Control | ERASE |
| READ | 1 v | 5 v | 0 v | 0 v | 0 v | 0 v | 5 v | 0 v | 0 v | 0 v |
| | | | | | | 1 v | 0 v | 0 v | 0 v | 0 v |
| | | | | | | 0 v | 5 v | 0 v | 0 v | 0 v |
| PROGRAMMING | 6 v | 12 v | 0 v | 0 v | 0 v | 0 v | 12 v | 0 v | 0 v | 0 v |
| | | | | | | 6 v | 0 v | 0 v | 0 v | 0 v |
| | | | | | | 0 v | 0 v | 0 v | 0 v | 0 v |
| ERASING | F | 0 v | F | 5 v | 15 v | All cells sharing the same row are erased. | | | | |
| NOT-ERASING | F | 0 v | F | 0 v | 0 v | — | — | — | — | — |

During all modes of operation, a cell is either selected or unselected. When a cell is selected the various lines to which it is connected are biased as shown in the above table. When a cell is unselected it is biased depending upon its location with respect to the selected cell according to the above table. The first line of voltages listed in the Unselected Cell Biases section shows the voltages applied to an unselected cell sharing the same gate line as the selected cell. The second line of voltages shows the biases to the unselected cell sharing the same bit line as the selected ell. The third line of voltages shows the biases applied to the unselected cell sharing only a control line with the selected cell.

During the READ mode, if the selected cell is a programmed cell having a voltage $V_T$ on the floating gate greater than 5 volts, no channel will be formed, thereby preventing any current from flowing on bit line 58. If the selected cell is in an "erased" state, which has a voltage $V_T$ of approximately 1.5 volts on the floating gate, conduction will occur from bit line 58 to common line 64 (through transistor 56), thereby allowing a current to flow and signaling that the cell is "on." If the unselected cell sharing the same bit line as the selected cell has been over-erased, a conduction channel will be formed, regardless of the program state of the unselected cell. No current will flow through the unselected cell because there is no conduction path from the selected cell to the common line due to both gate switch cell, the invention allows enormous increases in memory density.

In addition, the flash memory cell has a simpler fabrication than a two-transistor memory cell or a split gate memory cell. This makes the flash memory cell array more reliable and predictable during fabrication than would otherwise be possible using the more complicated EEPROM and split gate memory cells.

The "memory" array features that prevent the reading of erroneous data from an over-erased cell is not limited to memory arrays. Other applications include programmable logic devices ("PLD"), as well as other programmable products such as serial EEPROMs and programmable controllers.

The invention has been described with reference to specific embodiments. Other embodiments will be apparent to those of ordinary skill in the art. It is, therefore, not intended that the invention be limited, except as indicated by the appended claims.

I claim:
1. A non-volatile memory array comprising:
   a plurality of memory cells arranged in rows and columns, the columns interconnected by column lines, and the rows interconnected by row lines;

a first row switch disposed in each row and coupled to the row line for that row and to an extra column line;

isolation means disposed in each row to control connection of the row to a potential source for erasing the memory cells; and a second row switch connected to each of a pair of rows and to receive a control signal for connecting together the pair of rows in response to the control signal.

2. A memory as in claim 1 wherein:

all of the memory cells in a single row have gate electrodes coupled to a first node, and a gate electrode of the first row switch is connected to the first node;

all of the memory cells in a single row have source electrodes coupled to a second node, and a source electrode of the second row switch is connected to the second node;

all of the memory cells in a single column have drain electrodes coupled to a third node; and the first row switch in each row has a drain electrode coupled to the extra column line.

3. A memory as in claim 2 wherein the isolation means in each row comprises a transistor having a drain electrode coupled to the second node and gate and source electrodes coupled to an erase potential source.

4. A memory as in claim 3 wherein the second row switch comprises a transistor having one electrode coupled to the second node of the single row, another electrode coupled to the second node of a another row of memory cells, and having a gate coupled to a receive the control signal.

5. A semiconductor memory comprising a plurality of first row lines, a plurality of second row lines, a plurality of column lines, an array of memory cells arranged in rows and columns, each cell including a control electrode and first and second terminals, the control electrodes of all cells in each row being electrically connected to the first row line of that row, the first terminal of all cells in each column being electrically connected to the column line for that column, the second terminal of all cells in each row being electrically connected to the second row line, the memory cells further comprising:

a first switch in each row having a control electrode and a first and second terminal, the control electrode of the first switch being electrically connected to the first row line and the second terminal of the first switch being electrically connected to the second row line;

isolation means in each row having a control electrode and first and second terminals, the first terminal of the isolation means being electrically connected to the second row line and the control electrode of the isolation means being electrically connected to the second terminal of the isolation means and further connected to an erase potential;

an extra column line being electrically connected to the first terminal of each first switch in each row and to a potential source; and a control switch having a control electrode and first and second terminals, the first terminal of the control switch being electrically connected to a second row line of a selected row and the second terminal being electrically connected to a second row line in another row different from the selected row, and the control electrode of the control switch being electrically connected to a control line.

6. A memory array comprising single-transistor flash cells, each transistor having a floating gate, a control gate, a source, and a drain node, the memory array also comprising prevention means for minimizing the effect of floating gates in an over-erased state when accessing data stored in the memory array, the prevention means comprising:

a first row switch for each row, the first row switch coupled to the control gate of the flash cells in that row;

an extra column line coupling together the row switches in a common column; and isolation means disposed in each row to isolate that row from a source of erase potential except during erasing of the memory.

7. A memory array in claim 6 further comprising:

a second row switch means coupling pairs of rows of flash cells, the second row switch means having a control node and first and second terminals, the first terminal coupled to a first row of flash cells and the second terminal coupled to another row of flash cells.

8. A memory array comprising:

a first row of memory cells interconnected by a first row line;

a second row of memory cells interconnected by a second row line;

a first switch connected between the first row line and a potential source for erasing the memory cells in the first row;

isolation means connected between the second row line and the potential source for erasing the memory cells in the second row; and a second switch connected between the first row line and the second row line to connect the two together in response to a control signal.

9. A memory array as in claim 8 wherein the memory cells comprise flash cells such that each flash cell is a single field effect transistor having a floating gate capable of storing a charge and a control gate capable of activating the memory cell.

10. A memory array as in claim 9 wherein the isolation means comprises field effect transistor.

* * * * *